United States Patent
Hshieh et al.

(10) Patent No.: US 6,777,745 B2
(45) Date of Patent: Aug. 17, 2004

(54) SYMMETRIC TRENCH MOSFET DEVICE AND METHOD OF MAKING SAME

(75) Inventors: Fwu-Iuan Hshieh, Saratoga, CA (US); Koon Chong So, Fremont, CA (US); Richard A. Blanchard, Los Altos, CA (US)

(73) Assignee: General Semiconductor, Inc., Melville, NY (US)

(*) Notice: Subject to any disclaimer, the term of this patent is extended or adjusted under 35 U.S.C. 154(b) by 0 days.

(21) Appl. No.: 09/881,254

(22) Filed: Jun. 14, 2001

(65) Prior Publication Data

US 2002/0195655 A1 Dec. 26, 2002

(51) Int. Cl.$^7$ ............................ H01L 29/76; H01L 29/94
(52) U.S. Cl. ........................ 257/330; 257/327; 257/331; 257/335; 257/345
(58) Field of Search ................................ 257/327–335, 257/302, 345, 374; 438/270–271

(56) References Cited

U.S. PATENT DOCUMENTS

| | | | | |
|---|---|---|---|---|
| 4,116,720 A | * | 9/1978 | Vinson | 148/1.5 |
| 4,219,835 A | * | 8/1980 | van Loon et al. | 357/55 |
| 4,250,519 A | * | 2/1981 | Mogi et al. | 357/41 |
| 4,961,100 A | | 10/1990 | Baliga et al. | 257/172 |
| 5,021,845 A | * | 6/1991 | Hashimoto | 257/331 |
| 5,025,293 A | * | 6/1991 | Seki | 357/23.4 |
| 5,430,315 A | | 7/1995 | Rumennik | 257/331 |
| 5,877,538 A | | 3/1999 | Williams | 257/401 |
| 5,998,834 A | | 12/1999 | Williams et al. | 257/330 |
| 6,084,264 A | * | 7/2000 | Darwish | 257/329 |
| 6,096,608 A | | 8/2000 | Williams | 438/270 |
| 6,569,738 B2 | * | 5/2003 | Darwish | 438/270 |

OTHER PUBLICATIONS

Wolf, S., and Tauber, S.N., "Silicon Processing for the VLSI Era", vol. 1—Process Technology, 2000, Published by Lattice Press, Sunset Beach, CA (USA), Second Edition, p. 206.*

Baliga, B.J., "Modern Power Devices", Chapter 6 (Power Metal–Oxide Semiconductor Field–Effect Devices), Krieger Publishing Company (and John Wiley and sons) (1987), pp. 316–318, particularly p. 318, second paragraph (ISBN #: 0–89464–799–7).*

Sze, S.M., "Physics of Semiconductor Devices", Second Edition, John Wiley & Sons (1981), pp. 74–81.*

* cited by examiner

*Primary Examiner*—Nathan J. Flynn
*Assistant Examiner*—Johannes Mondt
(74) *Attorney, Agent, or Firm*—Mayer Fortkort & Williams, PC; David B. Bonham, Esq.

(57) ABSTRACT

A trench MOSFET transistor device and method of making the same are provided. The trench MOSFET transistor device comprises: (a) a drain region of first conductivity type; (b) a body region of a second conductivity type provided over the drain region, such that the drain region and the body region form a first junction; (c) a source region of the first conductivity type provided over the body region, such that the source region and the body region form a second junction; (d) source metal disposed on an upper surface of the source region; (e) a trench extending through the source region, through the body region and into the drain region; and (f) a gate region comprising (i) an insulating layer, which lines at least a portion of the trench and (ii) a conductive region, which is disposed within the trench adjacent the insulating layer. The body region in this device is separated from the source metal. Moreover, the doping profile within the body region and within at least a portion of the source and drain regions, when taken along a line normal to upper and lower surfaces of the device, is such that the doping profile on one side of a centerplane of the body region is symmetric with the doping profile on an opposite side of the centerplane.

18 Claims, 14 Drawing Sheets

_US 6,777,745 B2_

SYMMETRIC TRENCH MOSFET DEVICE AND METHOD OF MAKING SAME

FIELD OF THE INVENTION

The present invention relates to trench MOSFET devices, and more particularly to trench MOSFET devices having symmetric current-voltage characteristics.

BACKGROUND OF THE INVENTION

MOSFET (metal oxide semiconductor field effect transistor) technology advances have led to the development of a variety of transistor structures.

A conventional MOSFET structure is shown in FIG. 1A. This structure contains a P-type body region 102 with P+ contact region 103, a source region 104, a drain region 106 and a gate region, which consists of a doped polycrystalline silicon (polysilicon) conductive region 108 and a gate dielectric layer 109. An insulating layer 110 is provided over the conductive region 108. The electrical symbol of this structure is shown in FIG. 1B. This transistor has four terminals and has symmetric current versus voltage characteristics when the source and drain contacts are interchanged.

Another version of a MOSFET, known as a silicon-on-insulator ("SOI") MOSFET, is illustrated in FIG. 2A. This transistor has a similar structure to that of FIG. 1A, with P-type body region 202, source region 204, drain region 206, and a gate region consisting of a doped polysilicon conductive region 208 and a gate dielectric layer 209. An insulating layer 210 is provided over the conductive region 208. However, each transistor is formed on its own silicon island, so that it is electrically isolated by an insulator from all other transistors. The presence of an underlying layer of insulating material 211 provides this electrical isolation. Moreover, to increase device density, electrical contact is typically not made to the body region of the SOI MOSFET. The electrical symbol of this structure is shown in FIG. 2B. SOI MOSFETs, like conventional MOSFETs, have symmetric current versus voltage characteristics when the source and the drain regions are interchanged.

The electrical characteristics of the above conventional MOSFET and SOI MOSFET, however, differ in one significant fashion. The drain-to-source breakdown voltage of the conventional MOSFET will be affected by the voltage on its body region. When the body region is electrically shorted to the source region, the drain-to-source breakdown voltage, or $BV_{DSS}$, of the conventional MOSFET is equal to the collector-to-base breakdown voltage, $BV_{CBO}$, of the bipolar transistor that is intrinsic to the device. When the body region is not electrically connected at all (i.e., it is allowed to "float"), the $BV_{DSS}$ of the conventional MOSFET is equal to the collector-to-emitter breakdown voltage, $BV_{CEO}$, of the intrinsic bipolar transistor. The $BV_{CEO}$ of a conventional MOSFET is related to its $BV_{CBO}$ by the following equation (taken from Grove, Andrew S., *Physics and Technology of Semiconductor Devices*, John Wiley & Sons, 1967, p. 233):

$$BV_{CEO} = \frac{BV_{CBO}}{\sqrt[\eta]{\beta+1}}$$

Where $\eta$ is a number with a value in the range of 4 for an npn transistor and $\beta$ is the current gain of the transistor.

This equation indicates that a conventional MOSFET transistor with its body electrically floating has a lower breakdown voltage than the corresponding transistor with its body shorted to its source. Similarly, an SOI MOSFET, with its floating body region, has a lower breakdown voltage than it would have if its body were connected to its source. See, S. Cristoloveanu, "SOI, a Metamorphosis of Silicon", *IEEE Circuits & Devices, Jan.* 1999, pp. 26–32.

A double-diffused MOSFET, also known as a DMOS transistor, is another popular transistor structure. FIG. 3A illustrates a vertical DMOS transistor, which is provided with (a) P/P+ body regions 302, (b) N+ source regions 304, (c) gate regions of conductive doped polysilicon 308 and gate dielectric layer 309, with insulating layer 310 provided over the polysilicon 308, and (d) a common N-type drain region 306, all disposed over an N+ substrate 307. The polysilicon regions 308 are typically extended into a region outside the active area, where a common metal gate contact is provided. As can be seen from this figure, the P-type body regions 302 are shorted to the N+ source regions 304 thorough source metal 303. The electrical symbol of this structure is shown in FIG. 3B.

A variation of the vertical DMOS transistor of FIG. 3A is the trench DMOS transistor, illustrated in FIG. 4A, which includes (a) P/P+ body regions 402, (b) N+ source regions 404, (c) gate regions of conductive doped polysilicon 408 and gate dielectric layer 409, with insulating layer 410 provided over the polysilicon 408, and (d) a common N-type drain region 406, all disposed over an N+ substrate 407. In this structure, carrier flow between the source regions and the drain region occurs along the vertical sidewalls of trenches within the structure. The doped polysilicon 408 portions of the gate are separated from the channel regions within body regions 402 by gate dielectric 409 portions. Carrier flows from the source regions 404 to the drain region 406 when a sufficiently large gate-to-source voltage is applied (which creates the channel in body regions 402) and a drain-to-source voltage is present. The electrical symbol of this structure is shown in FIG. 4B.

DMOS transistors are used for high current and/or high voltage applications, because the DMOS structure provides at least the following advantages when compared to, for example, the conventional MOS structure of FIG. 1A:

(1) The channel length is set by the difference in the dopant profiles, which are formed by the sequential diffusion of the body and source regions from the same edge (i.e., from the upper surface). As a result, the channel length (L) can be quite short, resulting in a relatively high value of W/L per unit of surface area, where W is the amount of source perimeter. A high W/L value per unit of surface area is indicative of a high-current density device.

(2) The body-to-drain depletion region spreads in the direction of the drain, rather than into the channel region, resulting in higher breakdown voltages.

The current-versus-voltage curves of the vertical DMOS transistor of FIG. 3A and of the trench DMOS transistor of FIG. 4A are asymmetric due to the source-to-body diode that is present within the structures. For many applications, this asymmetry is not a factor. However, there are some applications where a symmetric characteristic is required. In such applications, two DMOS transistors with sources electrically connected together (and sometimes gates as well) are used, as shown schematically in FIG. 5. Unfortunately, the use of two DMOS transistors in series to form a bilateral switch requires significantly greater area than a single DMOS transistor having the same on-resistance.

SUMMARY OF THE INVENTION

The present invention addresses the above and other challenges in the prior art by providing a trench MOSFET transistor with symmetric current-voltage characteristics.

According to an embodiment of the invention, a trench MOSFET transistor device is provided which comprises: (a) a drain region of first conductivity type; (b) a body region of a second conductivity type provided over the drain region, such that the drain region and the body region form a first junction; (c) a source region of the first conductivity type provided over the body region, such that the source region and the body region form a second junction; (d) source metal disposed on an upper surface of the source region; (e) a trench extending through the source region, through the body region and into the drain region; and (f) a gate region comprising: (i) an insulating layer, which lines at least a portion of the trench and (ii) a conductive region, which is disposed within the trench adjacent the insulating layer. The body region in this device is separated from the source metal. Moreover, the doping profile within the body region and within at least a portion of the source and drain regions, when taken along a line normal to upper and lower surfaces of the device, is such that the doping profile on one side of a centerplane of the body region is symmetric with the doping profile on an opposite side of the centerplane.

According to another embodiment of the invention, a trench MOSFET transistor device is provided, which comprises: (a) a silicon drain region of N-type conductivity; (b) a silicon body region of P-type conductivity provided over the drain region, wherein the drain region and the body region form a first junction; (c) a silicon source region of N-type conductivity provided over the body region, wherein the source region and the body region form a second junction; (d) source metal disposed on an upper surface of the source region; (e) a trench extending through the source region, through the body region and into the drain region; and (f) a gate region comprising: (i) a silicon dioxide layer lining at least a portion of the trench and (ii) a doped polycrystalline silicon region disposed within the trench adjacent the silicon dioxide layer. Within this device: (a) the body region is separated from the source metal by the source region, (b) the source and drain regions comprise the same doping material, (c) the source and drain regions have peak net doping concentrations that are greater than a peak net doping concentration of the body region, and (d) the doping profile taken along a line normal to upper and lower surfaces of the device is such that, within the body region and within at least a portion of the source and drain regions, the doping profile on one side of a centerplane of the body region is symmetric with the doping profile on an opposite side of the centerplane.

According to another embodiment of the invention, a method of forming a trench MOSFET transistor device is provided which comprises: (a) providing a drain region of first conductivity type; (b) providing a body region of a second conductivity type over the drain region, the drain region and the body region forming a first junction; (c) providing a source region of the first conductivity type over the body region, the source region and the body region forming a second junction; (d) forming a trench that extends through the source region, through the body region and into the drain region; (e) forming an insulating layer over at least a portion of the trench; (f) providing a conductive region within the trench adjacent the insulating layer; and (g) providing source metal on an upper surface of the source region. This method is performed such that (i) the body region is separated from the source metal, and (ii) a doping profile along a line normal to upper and lower surfaces of the device is established in which, within the body region and within at least a portion of the source and drain regions, the doping profile on one side of a centerplane of the body region is symmetric with the doping profile on an opposite side of the centerplane.

In some embodiments, for example, the body region and the source region are formed prior to trench formation. In others, the body region is formed before trench formation and the source region is formed after trench formation. Various embodiments are available for forming the drain, body and source regions.

One advantage of the present invention is that a single MOSFET transistor with symmetric current-voltage characteristics is produced. This design requires significantly less surface area than a design based on two MOSET transistors in series.

The above and other embodiments and advantages of the present invention will become immediately apparent to those of ordinary skill in the art upon review of the following.

DETAILED DESCRIPTION OF PREFERRED EMBODIMENTS OF THE INVENTION

The present invention now will be described more fully hereinafter with reference to the accompanying drawings, in which preferred embodiments of the present invention are shown. This invention may, however, be embodied in different forms and should not be construed as limited to the embodiments set forth herein.

Figure 6A:
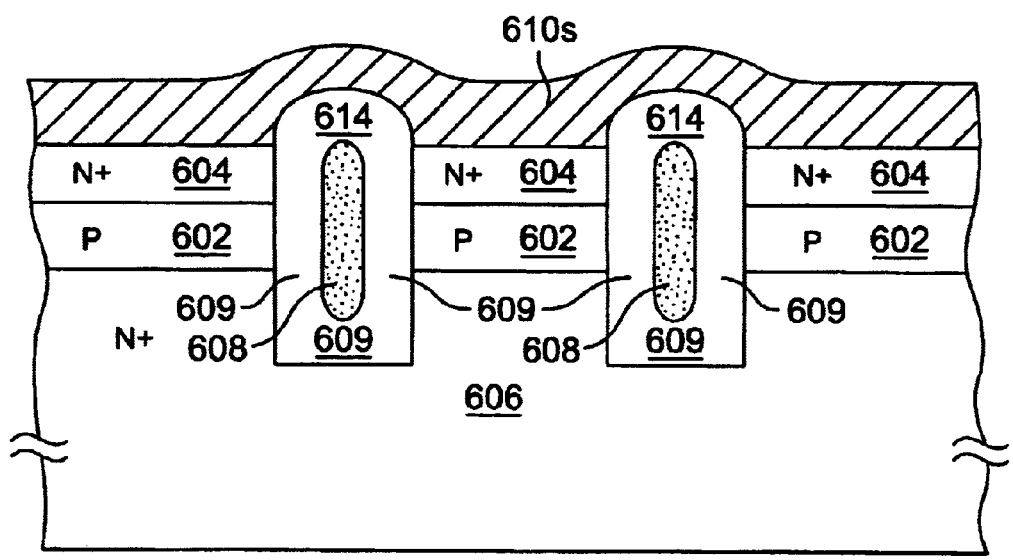
FIG. 6A is a schematic partial cross-sectional view of a trench MOSFET device in accordance with an embodiment of the present invention.

In accordance with an embodiment of the present invention, symmetric current-voltage performance can be obtained using a trench MOSFET transistor like that illustrated in FIG. 6A. In the trench MOSFET shown, the bottom layer is an N+ drain region 606. The drain region 606 is this example is a semiconductor substrate wafer, but the N+ drain region 606 can be also be formed in an epitaxial layer that is formed over a substrate wafer, if desired. The wafer in this example is silicon. However, the designs of the present invention can be used in connection with other semiconductors, including other elemental semiconductors, such as Ge, and compound semiconductors, such as Si Ge and III–V semiconductors (e.g., GaAs). The wafer in this example has a thickness ranging, for example, from 10 mils to 40 mils and a net doping concentration ranging, for example, from $10^{18}$ to $10^{21}$ cm$^{-1}$.

Over the N+ drain region 606 are P-body regions 602. In the example shown, these P-body regions have an associated upper p-n junction that is 0.1 to 3.0 microns from the upper semiconductor surface and a lower p-n junction that is 0.5 to 6.0 microns from the upper surface. The doping concentrations within the P-body regions 602 preferably range from $10^{14}$ to $10^{16}$ cm$^{-3}$. In this structure, the P-body regions 602 are electrically floating, which reduces the drain-to-source breakdown voltage, $BV_{DSS}$, of the device from the collector-to-base breakdown voltage, $BV_{CBO}$, of the bipolar transistor that is intrinsic to the device to the collector-to-emitter breakdown voltage, $BV_{CEO}$, of the intrinsic bipolar transistor. This reduction in breakdown, or sustaining, voltage is offset, however, by the symmetrical current-voltage characteristics that can be achieved with such a device.

N+ source regions 604 are provided at the semiconductor surface and extend, for example, to a depth of 0.1 to 3.0 microns into the semiconductor. These regions preferably have net doping concentrations ranging, for example, from $10^{18}$ to $10^{21}$ cm$^{-3}$.

The device of FIG. 6A also includes trenches, which extend, for example, to a depth of 1.0 to 8.0 microns from the upper semiconductor surface and are, for example, 0.25 to 2.0 microns in width. The regions between the trenches are frequently referred to as "mesas" or "trench mesas", based on their shapes. These regions range, for example, from 0.5 to 4.0 microns in width.

Within the trenches are provided conductive regions 608, which can be, for example, doped polycrystalline silicon. Alongside and below the conductive regions 608 are gate dielectric regions 609 (e.g., silicon oxynitride or silicon dioxide regions, preferably in a thickness of 20 to 1000 Angstroms), which are disposed between the conductive regions 608 and the semiconductor (i.e., between the conductive regions 608 and the P-body regions 602, drain region 606, and N+ source regions 604). Above the conductive regions 608 (and disposed between the conductive region 608 and source metal 610s) are insulating regions 614, which are formed, for example, from silicon dioxide or BPSG (borophosphosilicate glass).

Source metal 610s, which is typically formed of a metal such as aluminum, is in electrical contact with all of the source regions 604. Separate gate metal (not shown) is typically connected to a gate runner portion of the conductive region 608 located outside of the active region of the device. Drain metal (not shown) is also typically provided adjacent the N+ drain region 606.

Figure 6B:
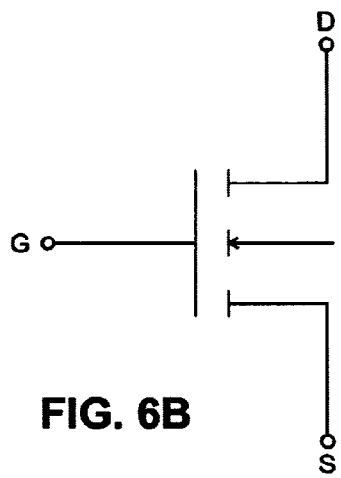
FIG. 6B is the electrical symbol of the device of FIG. 6A.

The electrical symbol for the device illustrated in FIG. 6A, with its floating body region, is shown in FIG. 6B.

Figure 7:
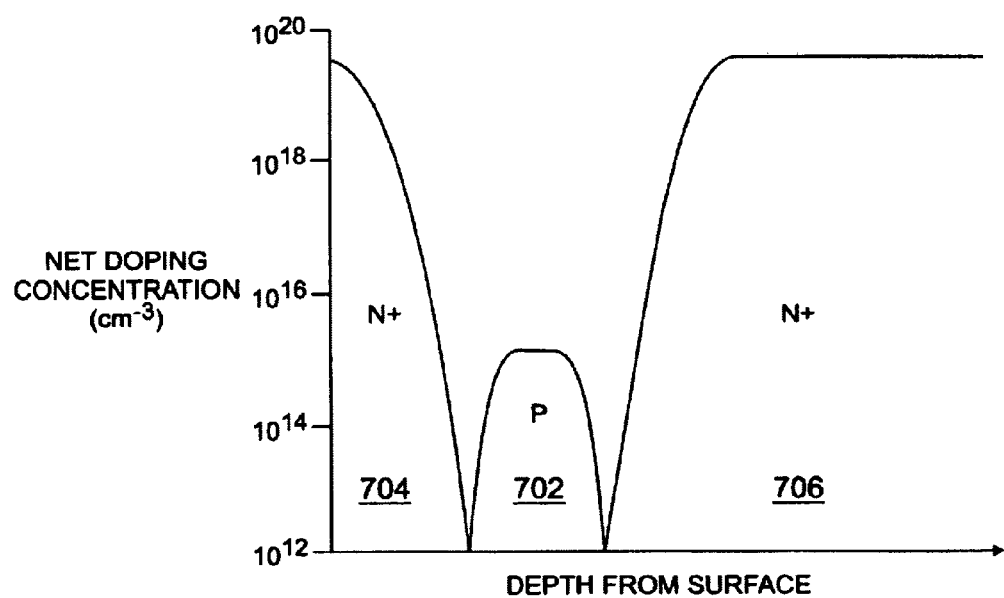
FIG. 7 illustrates approximate doping profiles within the device of FIG. 6A, according to an embodiment of the invention.

To obtain optimum device performance, the net doping concentration profile of the device of FIG. 6A should be symmetrical. An example of such a symmetric net doping profile is presented in FIG. 7, which illustrates the approximate doping profile along a line normal to the top semiconductor surface of the device. The left side of the x-axis in FIG. 7 corresponds to the semiconductor surface of the device, region 704 corresponds to the N+ source region 604 of the device, region 702 corresponds to the P-body region 602, and region 706 corresponds to the drain region 606. Note that the doping profile is such that the doping profile on one side of a centerplane of the P-body region 602 mirrors the doping profile on an opposite side of the centerplane. This symmetry holds true in a region that extends from the semiconductor surface and into the N+ drain region 706 of the device.

Figure 8A:
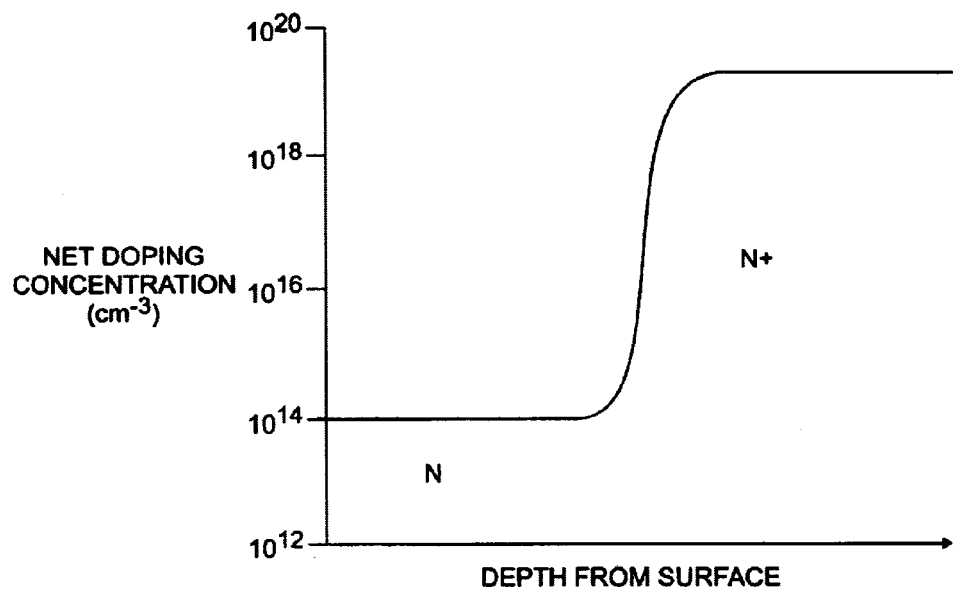
FIGS. 8A and 8B illustrate approximate doping profiles at various stages in the course of construction of a device like that of FIG. 6A, according to an embodiment of the invention.
Figure 8B:
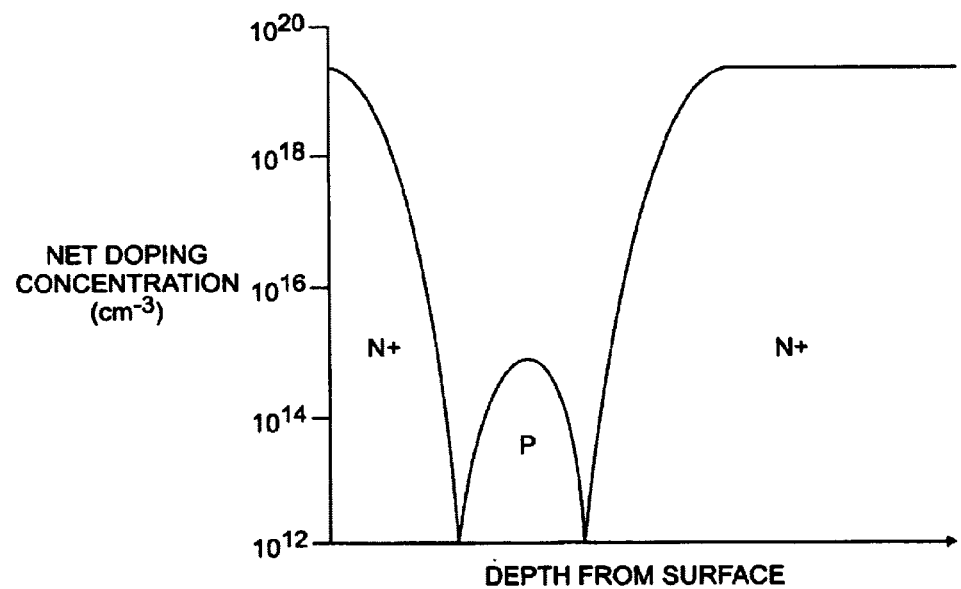
Figure 9A:
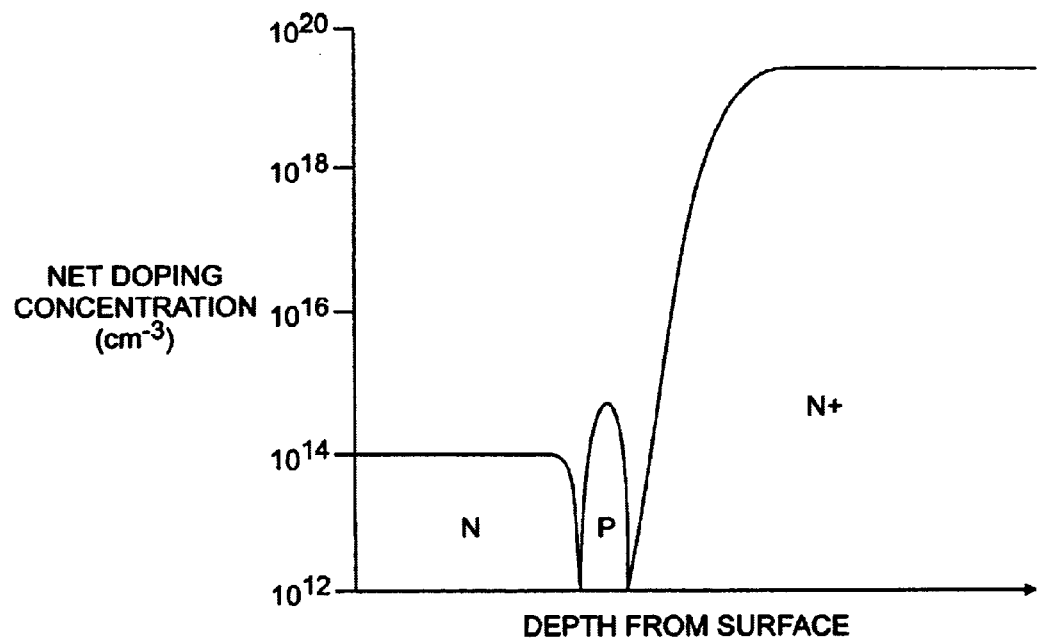
FIGS. 9A and 9B illustrate approximate doping profiles at various stages in the course of construction of a device like that of FIG. 6A, according to another embodiment of the invention.
Figure 9B:
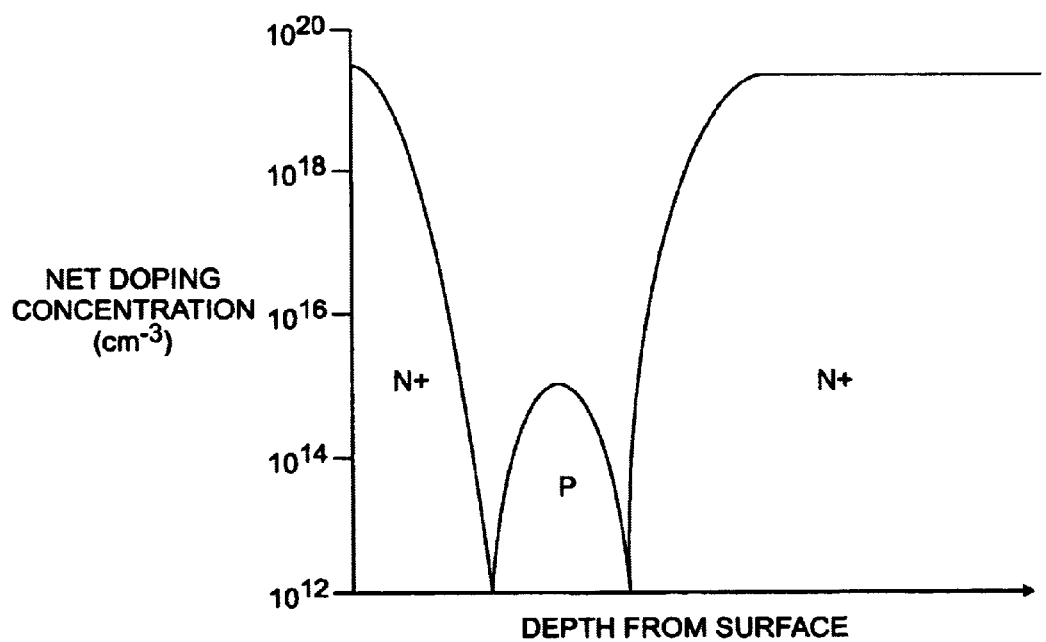
Figure 10A:
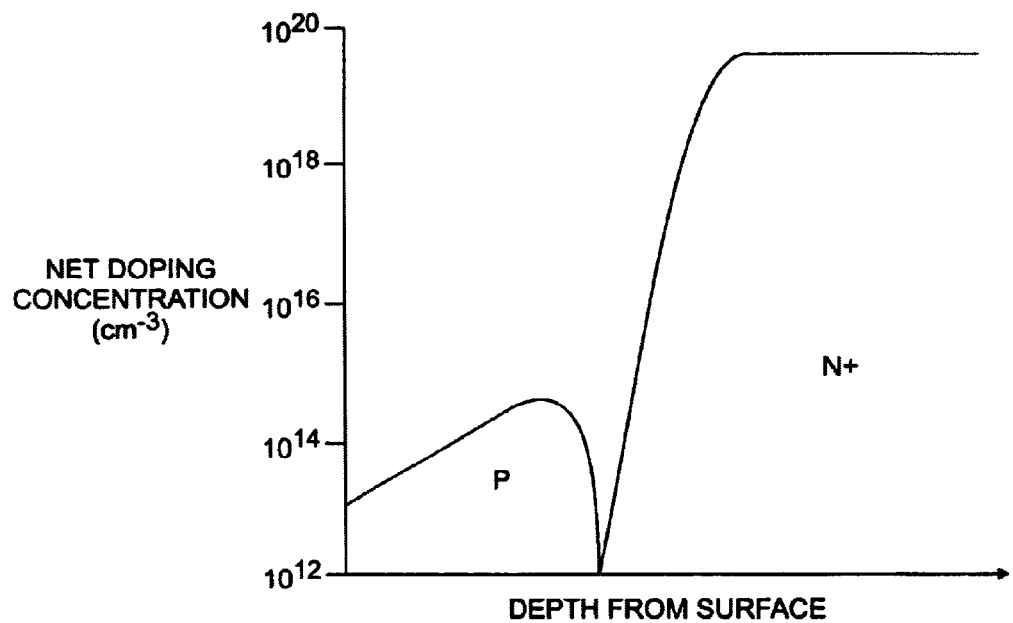
FIGS. 10A and 10B illustrate approximate doping profiles at various stages in the course of construction of a device like that of FIG. 6A, according to another embodiment of the invention.
Figure 10B:
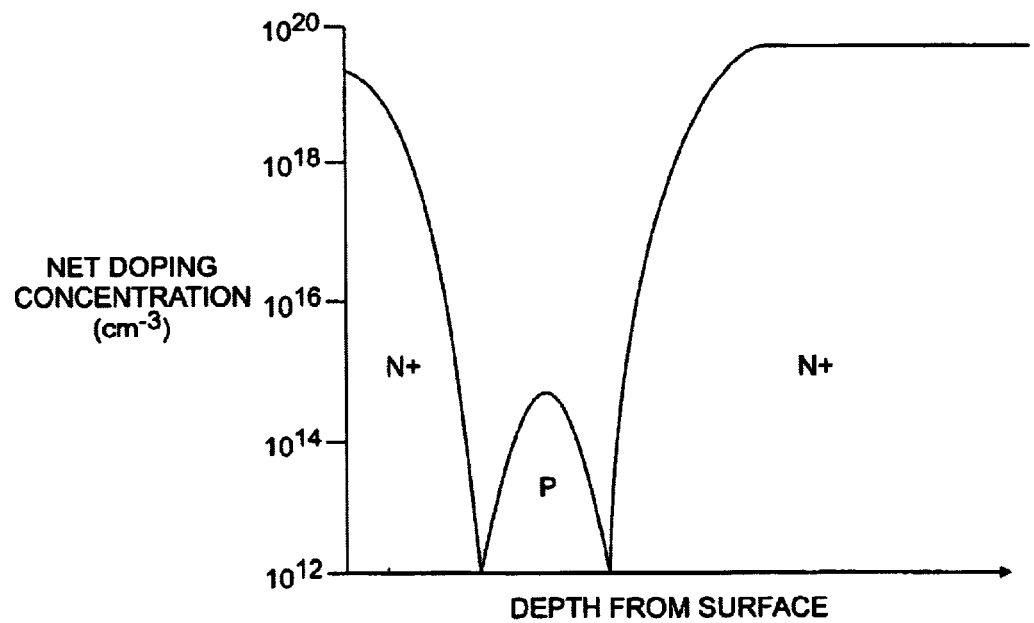
Figure 11A:
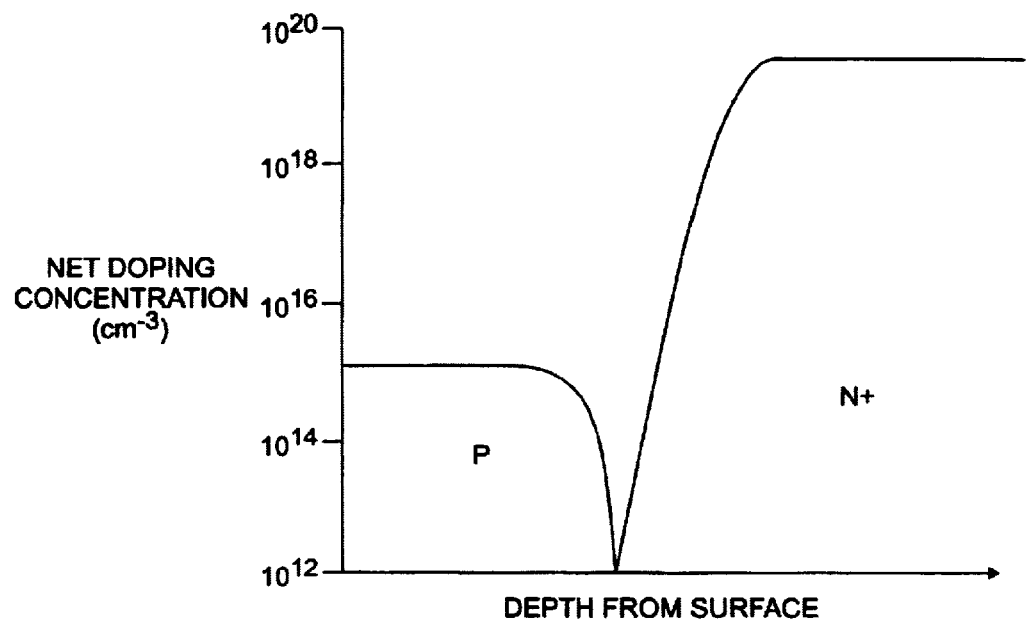
FIGS. 11A and 11B illustrate approximate doping profiles at various stages in the course of construction of a device like that of FIG. 6A, according to yet another embodiment of the invention.

A number of methods are available by which such a symmetrical dopant profile can be achieved, including the following:

a) According to one embodiment, an N-type epitaxial layer can be grown on an N+ substrate to produce the doping profile illustrated in FIG. 8A. A source dopant ion implantation step and a body dopant ion implantation step can then be performed, so that the peak of the body dopant after implantation is one-half of the distance from the peak of the source dopant to the peak of the drain dopant. Dopant diffusion at elevated temperature results in a doping profile like that of FIG. 8B. The source dopant may be introduced before the body dopant or vice versa.

b) According to another embodiment, P-type body dopant is introduced into the epitaxial layer both from the drain side and from the source side. As an example, P-type body dopant is implanted into an N+ substrate by ion implantation. Subsequently, an N-type epitaxial layer is grown over the ion-implanted substrate to produce the doping profile of FIG. 9A. Source dopant ion implantation and body dopant ion implantation steps are then performed. As above, the source dopant may be introduced before the body dopant or vice versa. Diffusion at elevated temperature results in a doping profile like that illustrated in FIG. 9B.

c) According to another embodiment, the body dopant profile is optimized by removing boron from the wafer surface using an optimized oxidation step, which follows a body-doping step but precedes a source-doping step. For example, an epitaxial layer is grown upon an N+ substrate. Boron (a P-type dopant) is implanted into the epitaxial layer, whereupon the boron is subjected to a drive-in step by heating at elevated temperature. An oxide layer is then grown on the epitaxial layer surface concurrently with the boron drive-in. Since boron is depleted from the surface of a doped region during oxidation (see, e.g., Grove, Andrew S., *Physics and Technology of Semiconductor Devices*, John Wiley & Sons, 1967, pp. 69–77), this process optimizes the boron profile prior to source introduction. The results of this procedure are illustrated in FIG. 10A. Subsequently, an N-type dopant can be implanted, followed by diffusion at elevated temperature, to produce the profile illustrated in FIG. 10B.

d) In another embodiment, the P-body dopant can be epitaxially introduced, followed by source implantation and diffusion. For example, a P-type epitaxial layer is first deposited upon an N+ substrate, producing a doping profile like that illustrated in FIG. 11A. An N-type dopant is subsequently implanted, followed by diffusion at elevated temperature, to produce the profile illustrated in FIG. 11B.

As previously noted, a major tradeoff in providing a floating body within the trench MOSFETs of the present invention, which allows current-voltage symmetry to be achieved, is a reduction in the drain-to-source breakdown voltage, or $BV_{DSS}$, of the device. The $BV_{DSS}$ can be increased, however, by decreasing the current gain or β of the intrinsic bipolar transistor. Techniques that can be used to decrease the gain of this bipolar transistor include the following:

(1) The dopant concentration in the base region can be increased. Because the maximum net p-type dopant concentration in the body region is one of the parameters that determine the threshold voltage of the MOSFET, there is minimal design flexibility in this parameter. Nonetheless, positive fixed charge can be introduced into the gate dielectric to counteract the threshold voltage increase caused by the higher body doping.

(2) A material that forms a Schottky barrier diode with the P-type body region may be used as a source of electrons, rather than the N+ diffused source regions as disclosed above. "Schottky source" MOSFETs have been discussed in the literature. This technique, however, would make it difficult or impossible to achieve doping symmetry like that shown in FIG. 7.

(3) The carrier lifetime in the base region can be decreased. This technique can be implemented by increasing the number of generation-recombination centers in the base region. The use of dopants (e.g., gold or platinum) and the use of radiation (e.g., electron or neutron irradiation) are well known techniques for reducing carrier lifetime by introducing generation-recombination centers. The increase in generation-recombination centers also increases the leakage current under high voltage conditions, but this increase in leakage current is offset by the increase in the breakdown voltage of the MOSFET.

A process sequence that can be used to produce the trench MOSFET device depicted in cross-section in FIG. 6A, as well as further details of the resulting structure outside the active region, will now be described in connection with FIGS. 12A–12D.

Figure 12A:
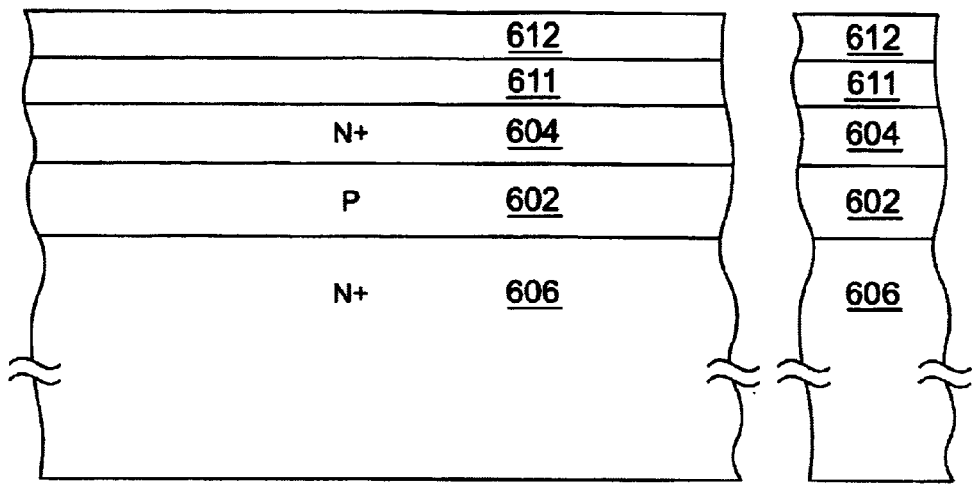
FIGS. 12A–12D are partial cross-sections illustrating a process for forming a trench MOSFET device like that depicted in FIG. 6A, according to an embodiment of the invention.

Referring to FIG. 12A, an N+ substrate 606 can be provided with a P-type layer 602 and an N-type layer 604 in a fashion such as those discussed above. For example, an N-epitaxial layer can be deposited on N+ substrate, followed by a P-type body implant and an N-type source implant as discussed in connection with method "a" above. Subsequently, a silicon dioxide layer 611 (pad oxide) that is typically 400 to 2000 Angstroms in thickness is formed, for example, by thermal oxidation. This step can also be used to diffuse the implanted N-type and P-type dopants. A silicon nitride layer 612 is then formed, for example, by chemical vapor deposition. A trench mask is formed from the oxide and nitride layers using methods known in the art, and trenches are etched in the silicon, for example by a plasma or reactive ion etching step. A sacrificial oxide layer is then typically grown within the trench and removed as is known in the art. A thin oxide layer 609, which is typically 20 to 1000 Angstroms thick, is then grown within the trenches, for example, by thermal oxidation.

Figure 12B:
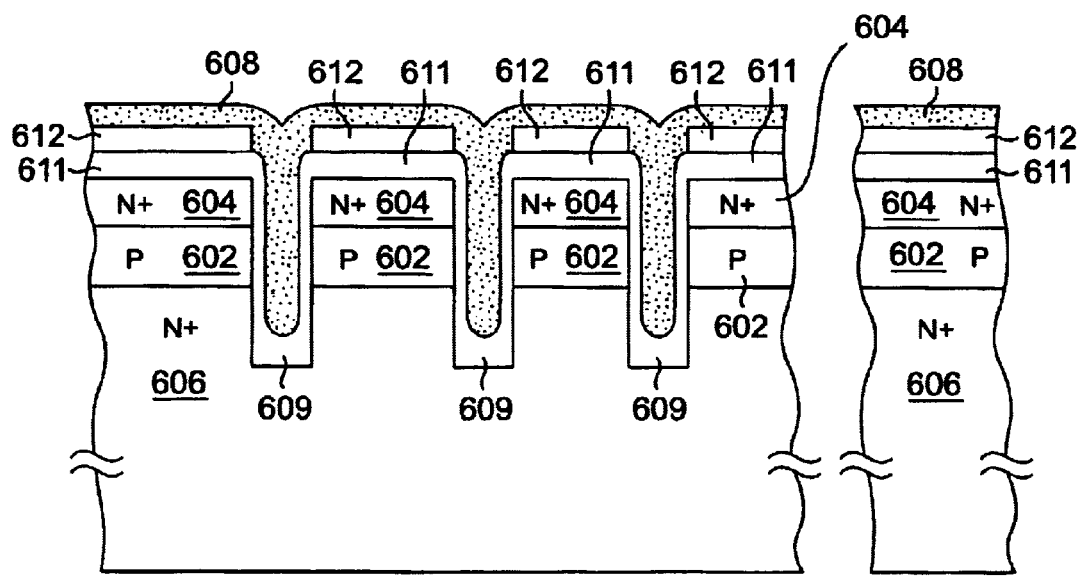

The surface of the structure is then covered, and the trenches are filled, with a polycrystalline silicon layer 608, preferably using CVD. The polycrystalline silicon is typically doped N-type to reduce its resistivity. N-type doping can be carried out, for example, during CVD with phosphine gas, by thermal pre-deposition using phosphorous oxychloride, or by implantation with arsenic or phosphorous. The resulting structure is illustrated in FIG. 12B After appropriate masking outside of the active region to preserve polycrystalline silicon for gate contact, the polycrystalline silicon layer is then etched, for example, by plasma or reactive ion etching, forming distinct polycrystalline silicon regions 608, which are connected in trenches out of the plane of the particular cross-section illustrated.

Figure 12C:
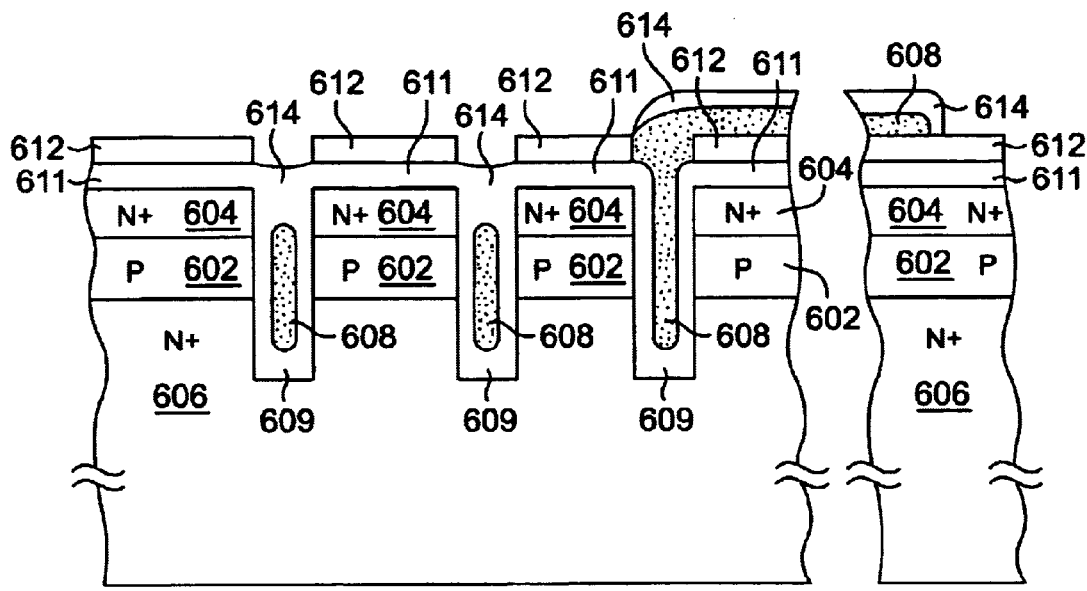
Figure 12D:
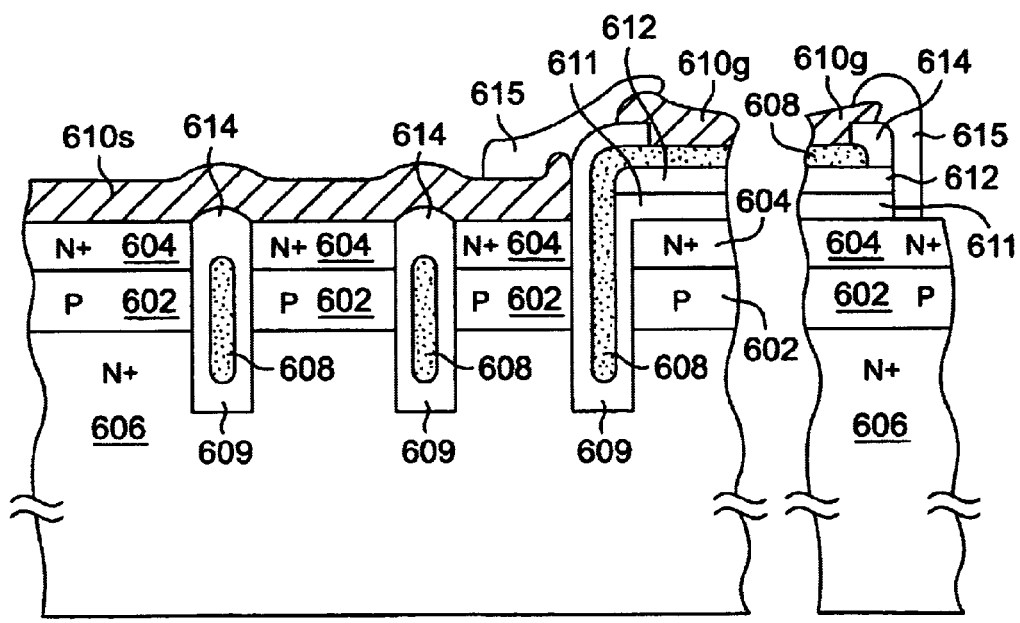

The mask is then removed, and surfaces of the polycrystalline silicon regions 608 are oxidized, for example by thermal oxidation, producing oxide regions 614. The resulting structure is shown in FIG. 12C.

The exposed silicon nitride 612 is then etched, for example, by wet etching using phosphoric acid. A contact mask is then applied, leaving a portion of the region 614 exposed outside the active region. The structure is then etched, for example, by plasma or wet etching. This step exposes a portion of the polycrystalline silicon outside the active region. The mask is then removed and the structure is etched, for example, by plasma or wet etching to remove regions 611 where uncovered, exposing source regions 604.

A metal deposition step and a masking operation are then performed, producing source metal 610s and gate metal 610g. A passivation layer, for example, a sandwich of CVD oxide and plasma nitride, is then provided, masked and etched, for example by plasma etching to produce passivation regions 615. The passivation mask is removed, resulting in the structure of FIG. 12D.

Myriad variations are possible. For example, although an N-type epitaxial layer is deposited in the above sequence, a P-type layer could also be deposited without compromising the performance of the device. Moreover, the body and source dopants are introduced using method "a" above, but other methods can be used. Furthermore, the process sequence of FIGS. 12A–12D uses neither a body masking step nor a source masking step, but it is possible to introduce the body and/or the source dopants using a body masking step, a source masking step or both. The above process also uses a layer of silicon nitride in the process sequence. However, a process that does not use silicon nitride, and uses a masking step to introduce the body and source diffusion in only some regions of the device, is also possible. One such process is depicted in FIGS. 13A–13D.

Figure 13A:
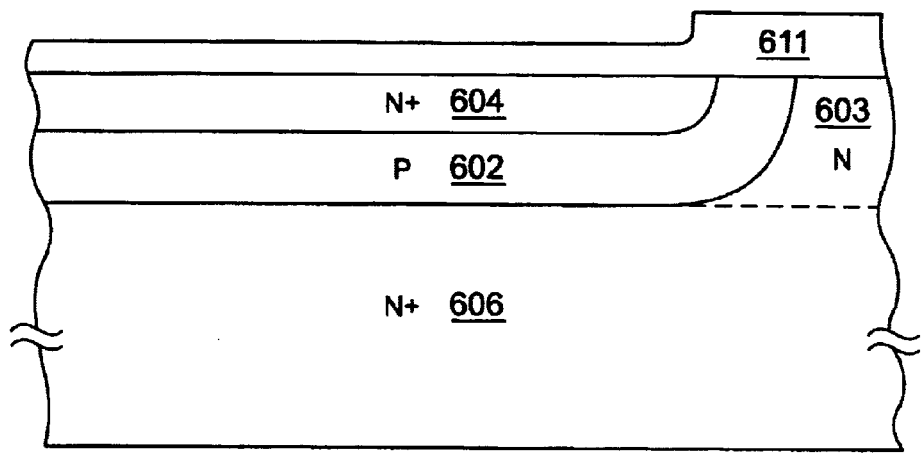
FIGS. 13A–13D are partial cross-sections illustrating a process for forming a trench MOSFET device like that depicted in FIG. 6A, according to another embodiment of the invention.

Referring to FIG. 13A, an N-type epitaxial layer 603 is deposited on N+substrate 606. The surface of the structure is then oxidized, for example, by thermal oxidation. The thus formed oxide layer is then masked and etched, for example, by either plasma or wet etching, until only a portion of the oxide layer outside the active region remains. After mask removal, P-type and N-type implantation steps are then performed as discussed in method "a" above. The surface of the semiconductor is then subjected to an additional oxidation step, for example, thermal oxidation, to produce and oxide layer of about 1000 to 10000 Angstroms in thickness. This oxidation step produces an oxide region 611 having an overall configuration like that shown in FIG. 13A. This oxidation step also acts to drive in the implanted P-type and N-type dopants, producing P-type layer 602 and an N-type layer 604.

A trench mask is then formed, and trenches are etched in the silicon, for example by a plasma or reactive ion etching step. A sacrificial oxide layer is then grown within the trench and removed as is known in the art. An oxide layer 609, which is typically 20 to 1000 Angstroms thick, is then grown within the trench, for example, by thermal oxidation.

Figure 13B:
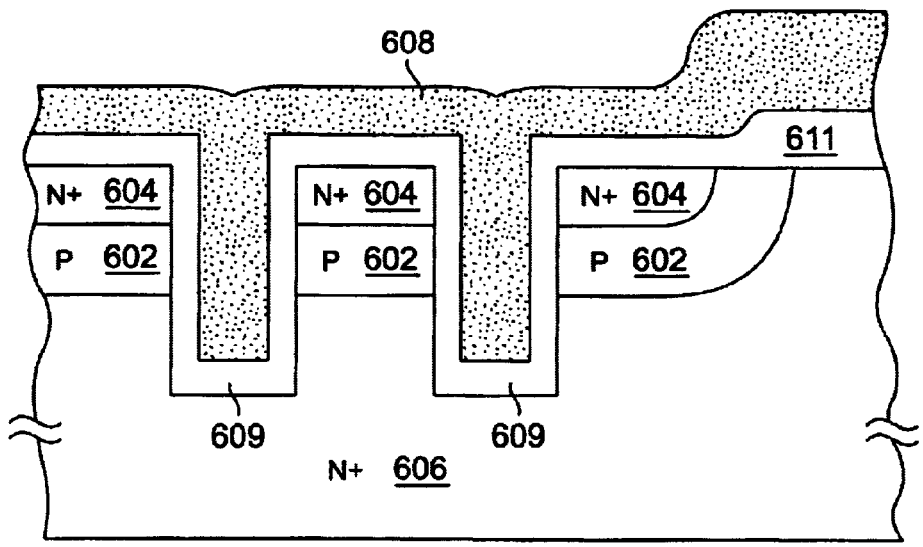

The trenches are next filled with a polycrystalline silicon layer 608. The resulting structure is shown in FIG. 13B.

Figure 13C:
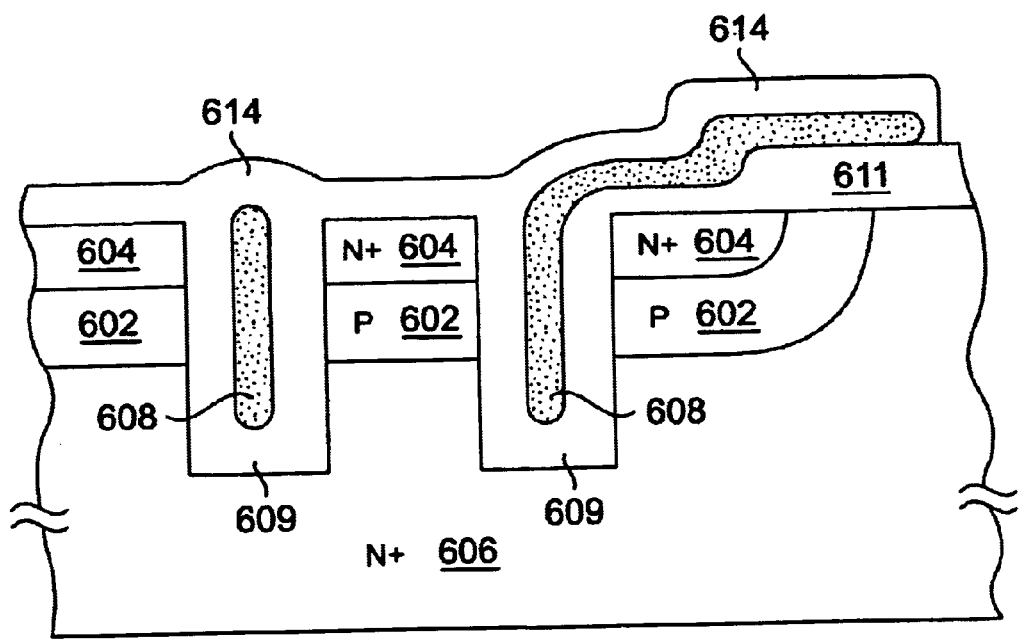
Figure 13D:
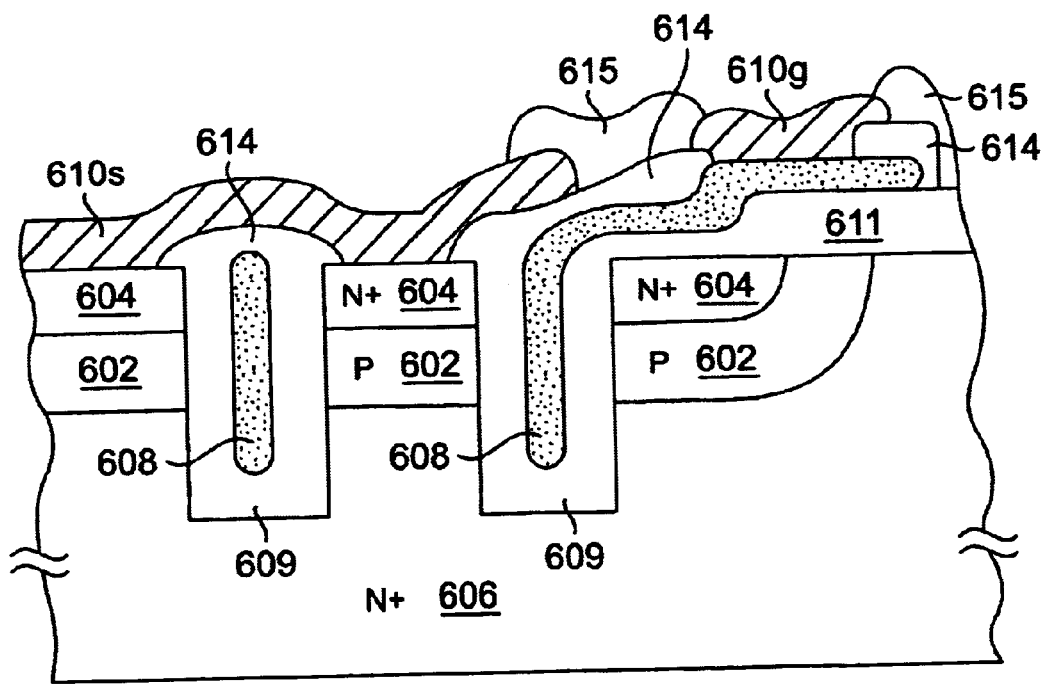

After appropriate masking outside the active region to preserve polycrystalline silicon for gate contact, the polycrystalline silicon layer is then etched, for example, by reactive ion etching, forming distinct polycrystalline silicon regions 608. The mask is then removed and surfaces of the polycrystalline silicon regions 608 are oxidized, for example by thermal oxidation, producing oxide regions 614. The resulting structure is illustrated in FIG. 13C.

A contact mask is then applied, leaving a portion of the oxide-covered polycrystalline silicon exposed outside the active region. The structure is then etched, for example, by plasma or wet etching. This step exposes a portion of the polycrystalline silicon outside the active region where electrical contact to the gate polysilicon 608 is to be made. The mask is then removed. The oxide covering the sources regions 604 is then removed using a blanket plasma or wet etch. A metal deposition step is next performed, and the metal is masked and etched, producing source metal 610s and gate metal 610g. The additional mask is removed. A passivation layer, for example, a sandwich of CVD oxide and plasma nitride, is then provided, masked and etched, for example by plasma etching to produce passivation regions 615. The mask is removed, resulting in the structure of FIG. 13D.

Although various embodiments are specifically illustrated and described herein, it will be appreciated that modifications and variations of the present invention are covered by the above teachings and are within the purview of the appended claims without departing from the spirit and intended scope of the invention. As one specific example, the method of the present invention may be used to form a structure in which the conductivities of the various semiconductor regions are reversed from those described herein.

What is claimed is:

1. A trench MOSFET transistor device comprising:
   a drain region of a first conductivity type;
   a body region of a second conductivity type provided over said drain region, said drain region and said body region forming a first junction;
   a source region of said first conductivity type provided over said body region, said source region and said body region forming a second junction;
   source metal disposed on an upper surface of said source region;
   a trench extending through said source region, through said body region and into said drain region; and
   a gate region comprising an insulating layer lining at least a portion of said trench and a conductive region within said trench adjacent said insulating layer,
   wherein (a) said body region is separated from said source metal, and (b) a doping profile along a line normal to upper and lower surfaces of said device is such that, (i) the doping profile is non-uniform within the body region, (ii) within said body region and within at least a portion of said source and drain regions, the doping profile on one side of a centerplane of the body region is substantially symmetric with the doping profile on an opposite side of the centerplane, and (iii) the doping profile comprises a substantially peaked central region.

2. The trench MOSFET transistor device of claim 1, wherein said body region is separated from said source metal by said source region.

3. The trench MOSFET transistor device of claim 1, further comprising gate metal adjacent said conductive region.

4. The trench MOSFET transistor device of claim 1, wherein the body region further comprises a material that provides generation-recombination centers.

5. The trench MOSFET transistor device of claim 4, wherein said material is selected from gold and platinum.

6. The trench MOSFET transistor device of claim 1, wherein said source, drain and body regions are doped silicon regions.

7. The trench MOSFET transistor device of claim 6, wherein said conductive region is doped polycrystalline silicon.

8. The trench MOSFET transistor device of claim 6, wherein said insulating layer is a silicon dioxide layer.

9. The trench MOSFET transistor device of claim 6, wherein said insulating layer is a silicon oxynitride layer.

10. The trench MOSFET transistor device of claim 1, wherein a fixed charge is provided within said insulating layer.

11. The trench MOSFET transistor device of claim 1, wherein said source and drain regions have peak net doping concentrations that are greater than a peak net doping concentration of said body region.

12. The trench MOSFET transistor device of claim 1, wherein said first conductivity type is N-type conductivity and said second conductivity type is P-type conductivity.

13. The trench MOSFET transistor device of claim 1, wherein said source and drain regions comprise the same dopant material.

14. The trench MOSFET transistor device of claim 1, wherein said trench MOSFET transistor device comprises a plurality of source regions which are shorted to one another.

15. A trench MOSFET transistor device comprising:
    a silicon drain region of N-type conductivity;
    a silicon body region of P-type conductivity provided over said drain region, said drain region and said body region forming a first junction;
    a silicon source region of N-type conductivity provided over said body region, said source region and said body region forming a second junction;
    source metal disposed on an upper surface of said source region;
    a trench extending through said source region, through said body region and into said drain region; and
    a gate region comprising a silicon dioxide layer lining at least a portion of said trench and a doped polycrystalline silicon region within said trench adjacent said silicon dioxide layer,
    wherein (a) said body region is separated from said source metal by said source region, (b) said source and drain regions comprise the same doping material, (c) said source and drain regions have peak net doping concentrations that are greater than a peak net doping concentration of said body region, and (d) a doping profile along a line normal to upper and lower surfaces of said device is such that, (i) the doping profile is non-uniform within the body region, (ii) within said body region and within at least a portion of said source and drain regions, the doping profile on one side of a centerplane of the body region is substantially symmetric with the doping profile on an opposite side of said centerplane, and (iii) the doping profile comprises a substantially peaked central region.

16. The trench MOSFET transistor device of claim 15, wherein said doping material comprises arsenic.

17. The trench MOSFET transistor device of claim 15, wherein said doping material comprises phosphorous.

18. The trench MOSFET transistor device of claim 15, wherein said trench MOSFET transistor device comprises a plurality of source regions which are shorted to one another.

* * * * *

UNITED STATES PATENT AND TRADEMARK OFFICE
CERTIFICATE OF CORRECTION

PATENT NO. : 6,777,745 B2
DATED : August 17, 2004
INVENTOR(S) : Hshieh et al.

Figure 1A:
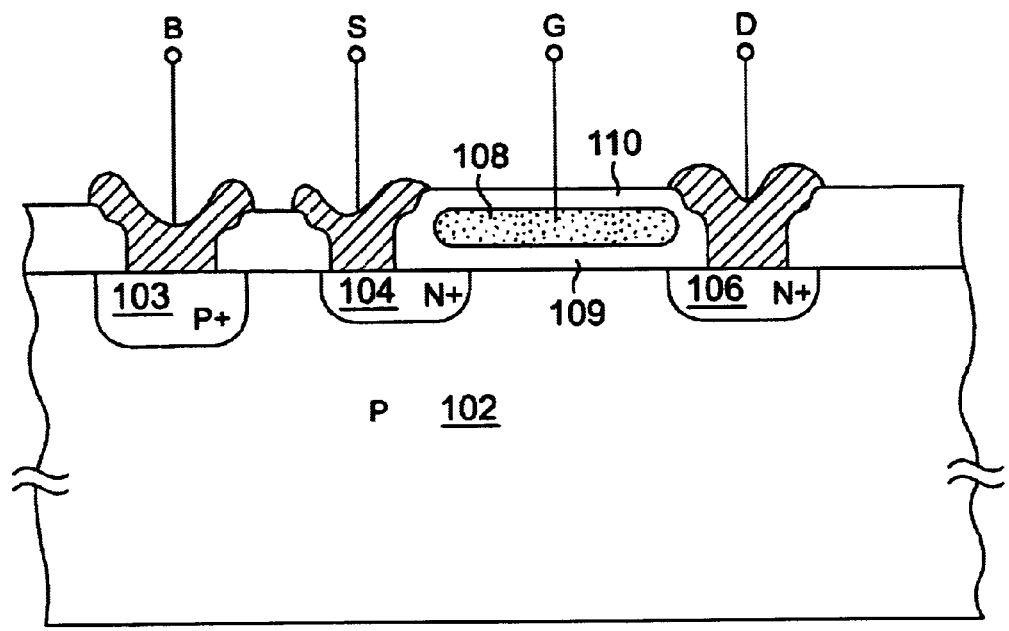
FIG. 1A is a schematic partial cross-sectional view of a conventional MOSFET device in the prior art.
Figure 1B:
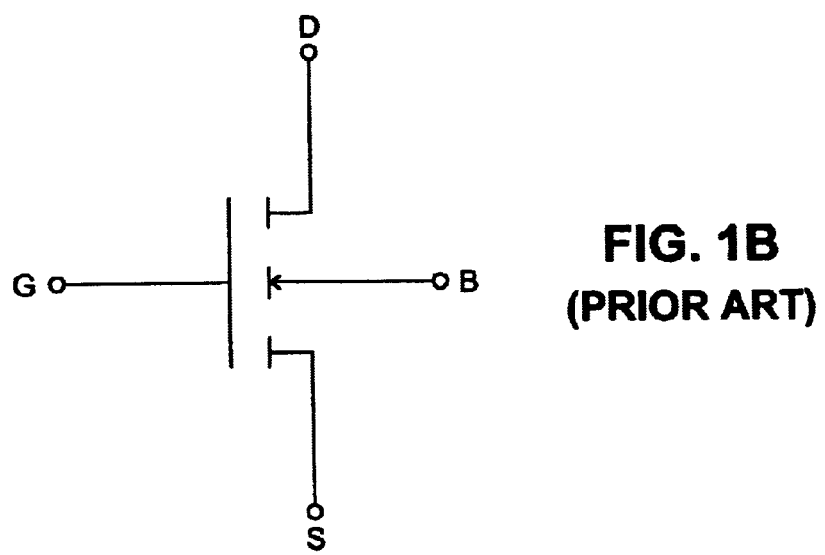
FIG. 1B is the electrical symbol of the device of FIG. 1A.
Figure 2A:
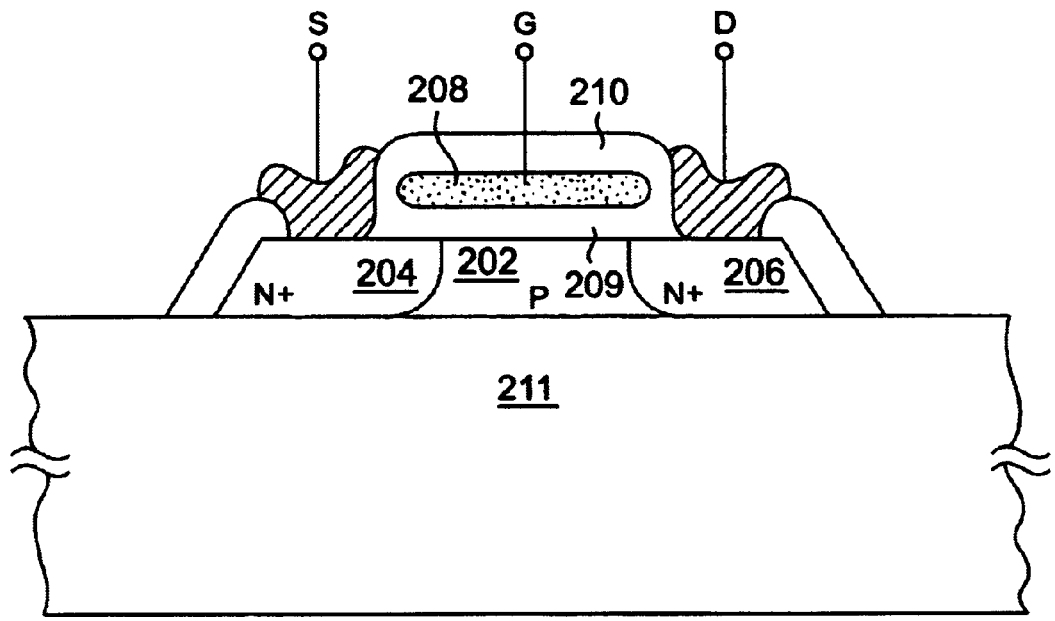
FIG. 2A is a schematic partial cross-sectional view of an SOI MOSFET device in the prior art.
Figure 2B:
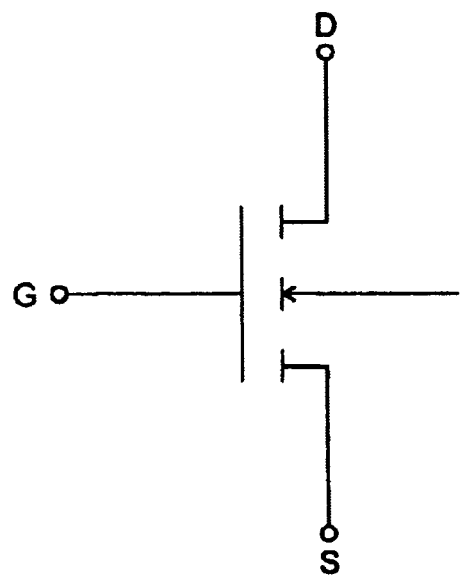
FIG. 2B is the electrical symbol of the device of FIG. 2A.
Figure 3A:
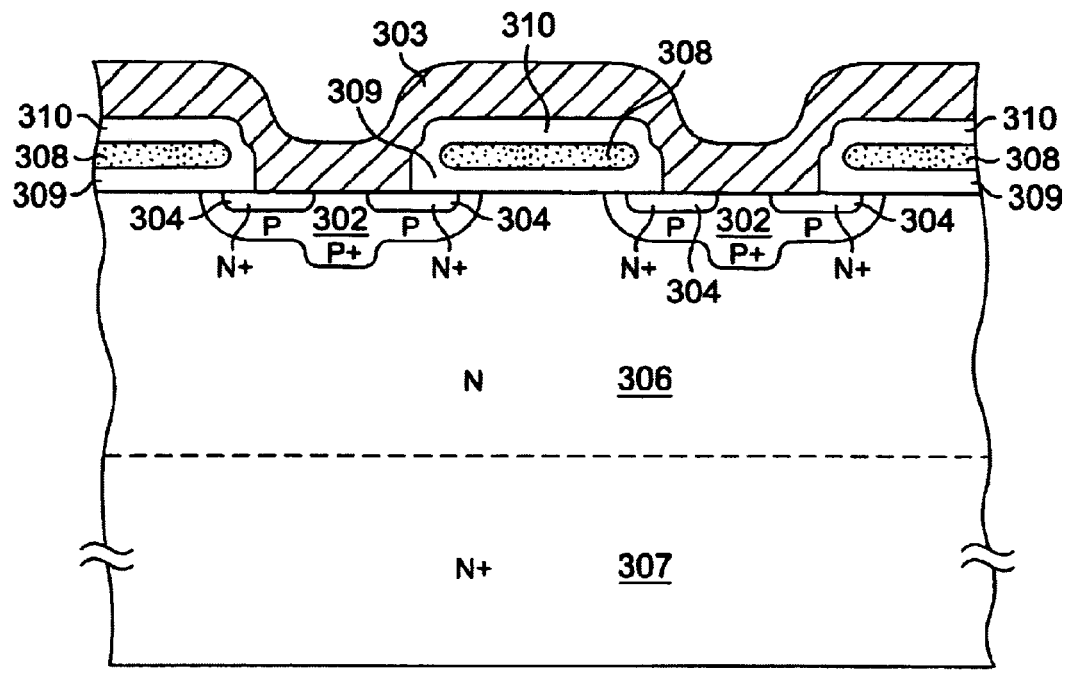
FIG. 3A is a schematic partial cross-sectional view of a vertical DMOS transistor in the prior art.
Figure 3B:
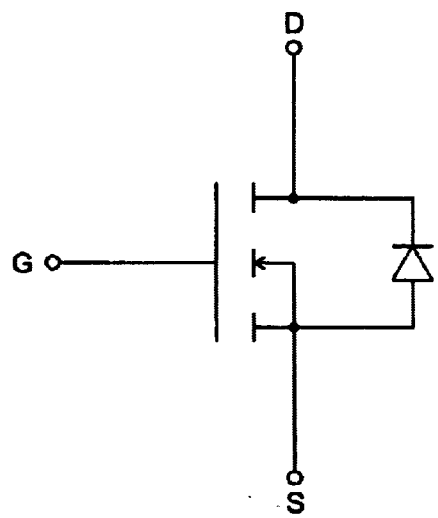
FIG. 3B is the electrical symbol of the device of FIG. 3A.
Figure 4A:
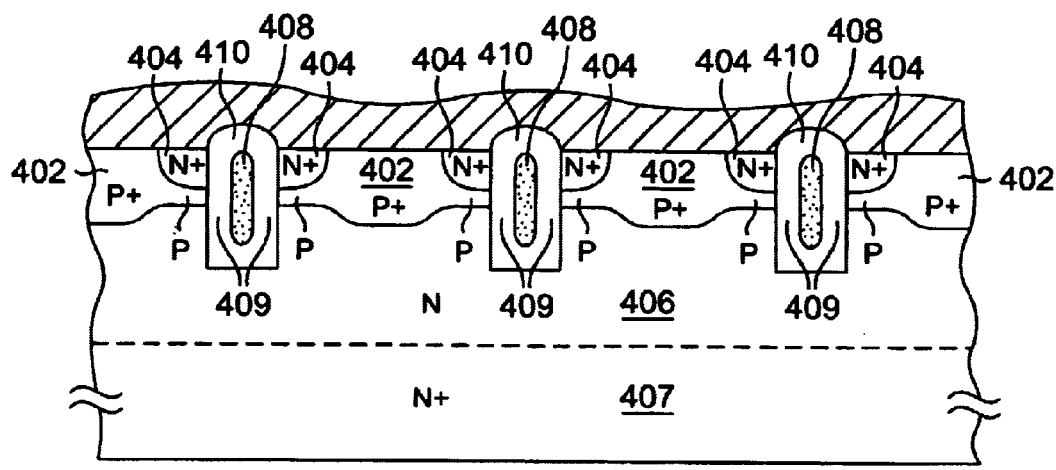
FIG. 4A is a schematic partial cross-sectional view of a trench DMOS transistor device in the prior art.
Figure 4B:
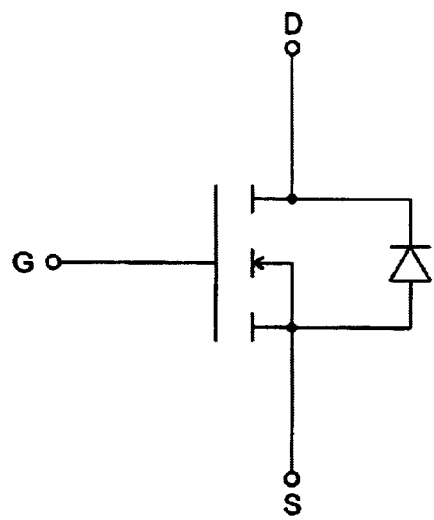
FIG. 4B is the electrical symbol of the device of FIG. 4A.
Figure 5:
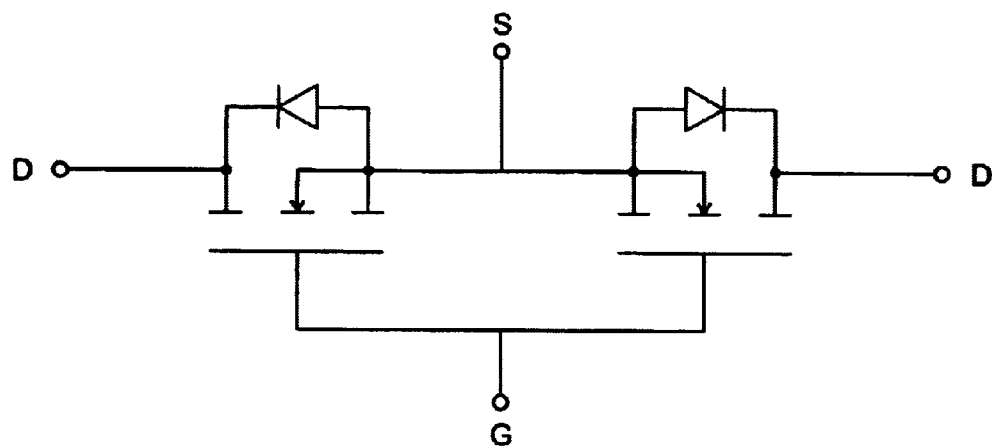
FIG. 5 is the electrical symbol of two DMOS transistors with sources and gates electrically connected together.
Figure 11B:
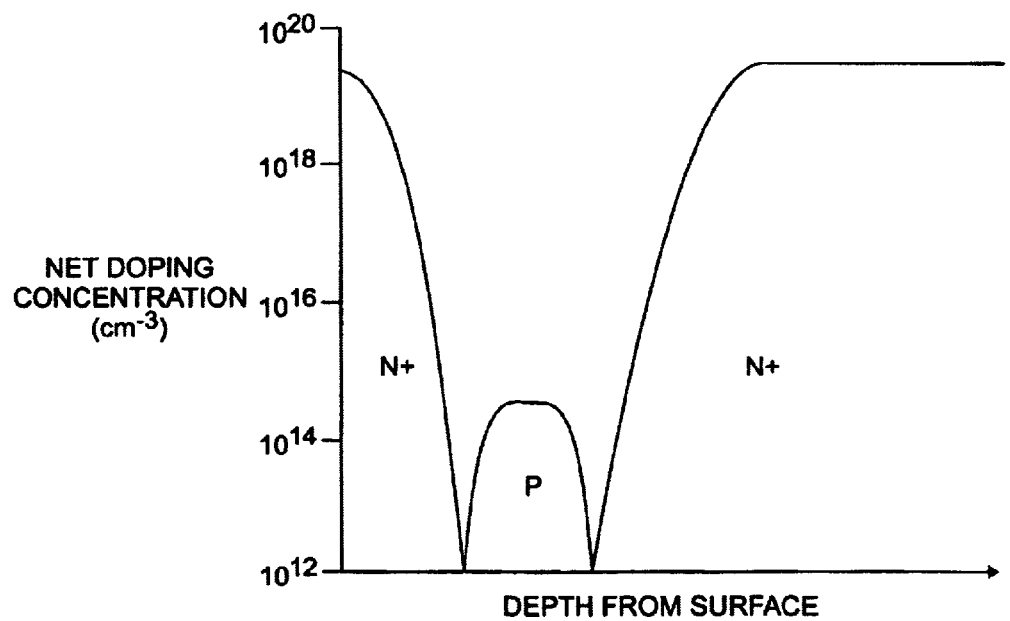

It is certified that error appears in the above-identified patent and that said Letters Patent is hereby corrected as shown below:

Column 7,
Line 10, change "illustrated in FIG. 1B." to -- illustrated in FIG. 11B. --.

Column 8,
Line 59, change "to produce and" to -- to produce an --.

Signed and Sealed this

First Day of February, 2005

JON W. DUDAS
*Director of the United States Patent and Trademark Office*